US010783216B2

(12) United States Patent
Huggett et al.

(10) Patent No.: US 10,783,216 B2
(45) Date of Patent: Sep. 22, 2020

(54) METHODS AND APPARATUS FOR IN-PLACE FAST FOURIER TRANSFORM (71) Applicant: SEMICONDUCTOR COMPONENTS INDUSTRIES, LLC, Phoenix, AZ (US)

(72) Inventors: Anthony Richard Huggett, Reading (GB); Martin Stuart Abrahams, South Wonston (GB)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 43 days.

(21) Appl. No.: 16/139,339

(22) Filed: Sep. 24, 2018

(65) Prior Publication Data
US 2020/0097519 A1  Mar. 26, 2020

(51) Int. Cl.
*G06F 17/14* (2006.01)
*G06F 5/06* (2006.01)
*G11C 8/04* (2006.01)

(52) U.S. Cl.
CPC .......... *G06F 17/142* (2013.01); *G06F 5/065* (2013.01); *G11C 8/04* (2013.01)

(58) Field of Classification Search
CPC .......... G06F 17/142; G06F 5/065; G11C 8/04
USPC .................................................. 708/403–409
See application file for complete search history.

(56) References Cited

U.S. PATENT DOCUMENTS

| 2004/0243656 | A1  | 12/2004 | Sung |
| 2005/0010628 | A1  | 1/2005  | Vinitzky |
| 2005/0182806 | A1  | 8/2005  | Krishnamoorthi |
| 2006/0253514 | A1* | 11/2006 | Yu .................. G06F 17/142 708/404 |
| 2008/0071848 | A1  | 3/2008  | Baireddy |
| 2010/0017452 | A1  | 1/2010  | Lee |
| 2012/0254273 | A1* | 10/2012 | Asanaka ............ G06F 17/142 708/404 |

* cited by examiner

*Primary Examiner* — Tan V Mai
(74) *Attorney, Agent, or Firm* — The Noblitt Group, PLLC; Hettie L. Haines (57) ABSTRACT

Various embodiments of the present technology may comprise a method and apparatus for in-place fast Fourier transform (FFT). According to various embodiments, the apparatus comprises a RAM, having a single address space, divided into a plurality of sub-memory spaces, where the number of sub-memory spaces is a function of a length of the FFT such that the two inputs are always from different sub-memories, as are the two outputs. According to various embodiments, the apparatus may further comprise a division circuit configured to perform a "bitwise" division operation in order to convert addresses from the aforementioned single address space to the particular sub-memories and addresses within them. According to various embodiments, the apparatus may further comprise a butterfly processor capable of performing a butterfly operation.

20 Claims, 8 Drawing Sheets

| SPLIT ADDRESS As | RAM 0 | RAM 1 | RAM 2 | RAM 3 | RAM 4 |
|---|---|---|---|---|---|
| 0 | 0 | 1 | 2 | 3 | 4 |
| 1 | 5 | 6 | 7 | 8 | 9 |
| 2 | 10 | 11 | 12 | 13 | 14 |
| 3 | 15 | 16 | 17 | 18 | 19 |
| 4 | 20 | 21 | 22 | 23 | 24 |
| 5 | 25 | 26 | 27 | 28 | 29 |
| 6 | 30 | 31 | 32 | 33 | 34 |
| ⋮ | ⋮ | ⋮ | ⋮ | ⋮ | ⋮ |
| 12 | 60 | 61 | 62 | 63 | 64 |
| ⋮ | ⋮ | ⋮ | ⋮ | ⋮ | ⋮ |
| 19 | 95 | 96 | 97 | 98 | 99 |
| | ⋮ | ⋮ | ⋮ | ⋮ | ⋮ |

METHODS AND APPARATUS FOR IN-PLACE FAST FOURIER TRANSFORM

BACKGROUND OF THE TECHNOLOGY

Various applications, such as communication systems, signal processing systems, and image processing systems utilize various signal processing operations such as an inverse fast Fourier transform (IFFT) operation, an fast Fourier transform (FFT) operation, and the like. To perform these operations, the system may employ a specialized processor to perform various computations. One type of such specialized processor may perform operations "in-place." In the case of an "in-place" FFT operation, inputs are read from a number of locations in a memory and the same number of outputs are written back to the same locations, thereby overwriting the data that was input. With only one single-port memory, the data must be read one element at a time, and then written back one element at a time. The memory bandwidth, therefore, becomes a limiting factor upon the speed of the specialized processor. Dividing the memory into a smaller number of sub-memories to avoid this bandwidth limitation is not trivial—at various points in the algorithm the FFT may require to operate on more than one element from the same sub-memory in order to perform one step of the algorithm, which will slow the operation down.

SUMMARY OF THE INVENTION

Various embodiments of the present technology may comprise a method and apparatus for in-place fast Fourier transform (FFT). According to various embodiments, the apparatus comprises a RAM, having a single address space, divided into a plurality of sub-memory spaces, where the number of sub-memory spaces is a function of a length of the FFT such that the two inputs are always from different sub-memories, as are the two outputs. According to various embodiments, the apparatus may further comprise a division circuit configured to perform a "bitwise" division operation in order to convert addresses from the aforementioned single address space to the particular sub-memories and addresses within them. According to various embodiments, the apparatus may further comprise a butterfly processor capable of performing a butterfly operation.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various multiplexers, control circuits, butterfly processors, counters, and the like, which may carry out a variety of functions. In addition, the present technology may operate in conjunction with any number of systems, such as communication systems, signal processing systems, image processing systems, and the like.

Figure 1:
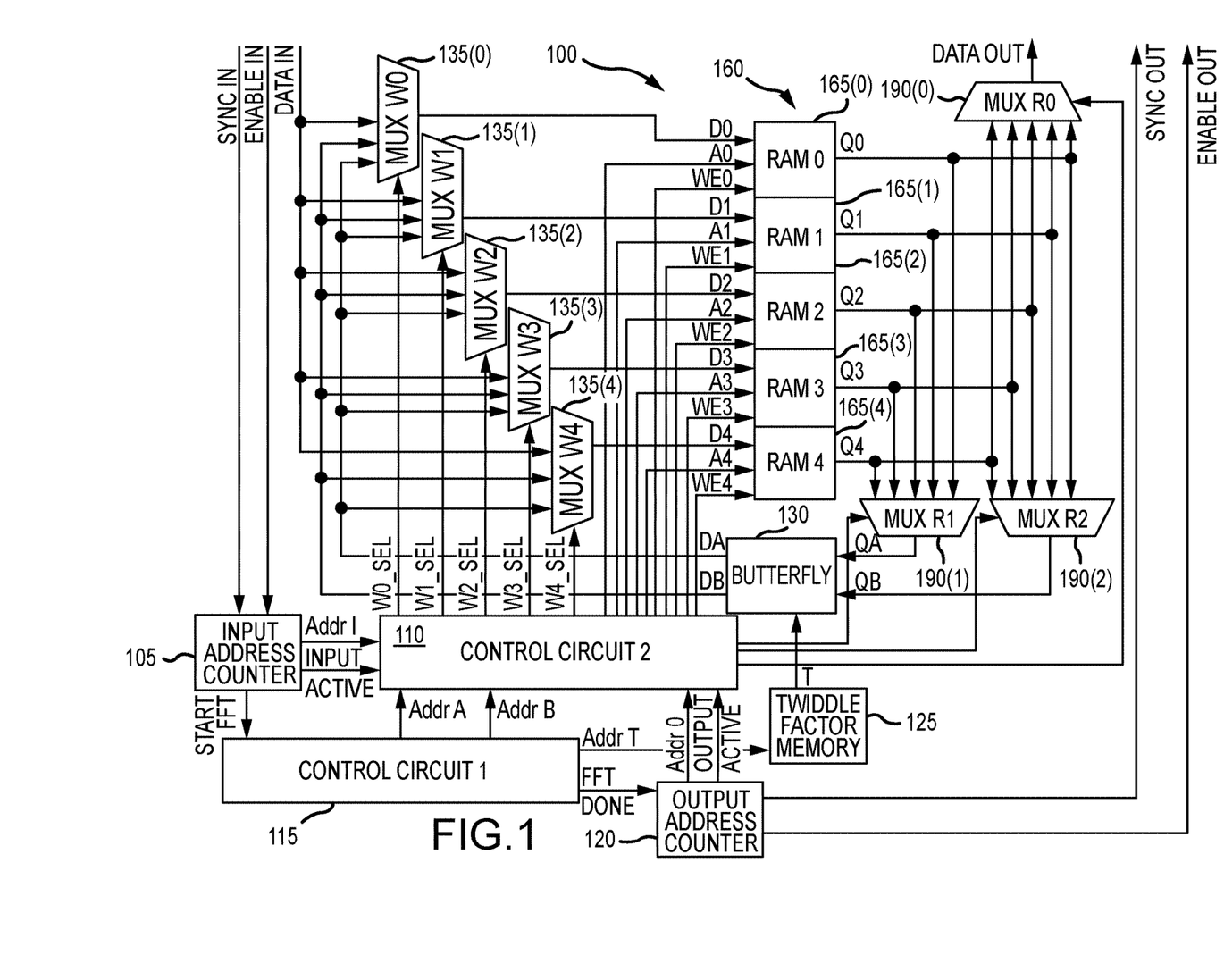
FIG. 1 is a block diagram of a system in accordance with an exemplary embodiment of the present technology.

Referring to FIG. 1, the system 100 may be configured to perform various signal processing operations, such as fast Fourier transform (FFT). The system 100 may be configured to process an N-point FFT, where N is the length of the FFT. Additionally, the system 100 may be configured to perform the various operation "in-place," wherein inputs and outputs for a particular operation cycle are stored in the same memory location. According to an exemplary embodiment, the system 100 may comprise a first control circuit 115, a second control circuit 110, an input address counter 105, an output address counter 120, a butterfly processor 130, a twiddle factor memory 125, a plurality of writing multiplexers 135, a plurality of reading multiplexers 190, and a main memory 160, such as a random-access memory (RAM) device.

According to an exemplary embodiment, the system 100 may be configured to receive various input control signals and input data and transmit various output control signals and output data. For example, the system 100 may receive a 'SYNC IN' signal and an 'ENABLE IN' signal as well input data ('DATA IN'). The system 100 may transmit a 'SYNC OUT' signal and an 'ENABLE OUT' signal as well as output data ('DATA OUT').

The input address counter 105 may be configured to receive various control signals, such as the 'SYNC IN' signal and the 'ENABLE IN' signal. The input address counter 105 may comprise a conventional counter circuit and may be responsive to control signals (e.g., 'SYNC IN' signal and the 'ENABLE IN' signal). For example, the input address counter 105 may start or stop according to the control signals. The input address counter 105 may generate a control signal, such as a 'START FFT' signal, and transmit the control signal to the first control circuit 115. For example, the input address counter 105 may be configured to generate and transmit the 'START FFT' signal when the counter has reached a predetermined counter number.

The input address counter 105 may further generate an input address signal 'Addr I' and an input signal ('INPUT ACTIVE') according to a particular count number. The input address counter 105 may transmit the input address signal 'Addr I' and the 'INPUT ACTIVE' signal to the second control circuit 110.

According to various embodiments, the input address counter 105 may be further configured to perform bit reversal on the input data ('DATA IN').

The first control circuit 115 may be configured to perform various control functions, such as starting an FFT operation, signaling an end of an FFT operation, and/or address generation. According to an exemplary embodiment, the first control circuit 115 is connected to the input address counter 105 and responsive to the 'START FFT' signal. For example, the first control circuit 115 may start an FFT operation according to the 'START FFT' signal.

In addition, the first control circuit 115 may generate various control signals. For example, the first control circuit 115 may be configured to generate a first address 'Addr A' and a second address 'Addr B', wherein each address corresponds to a particular address within the main memory 160. The first control circuit 115 may transmit the first and second address 'Addr A', 'Addr B' to the second control circuit 110.

In an exemplary embodiment, the first control circuit 115 may further generate a first delayed address signal 'Addr_AD' (not shown) and a second delayed address signal 'Addr_BD' (not shown) to the second control circuit 110. The first and second delayed address signals are delayed versions of the first and second address 'Addr A' and 'Addr B', respectively.

The first control circuit 115 may be further configured to generate a twiddle address 'Addr T' and a stop signal ('FFT Done'). For example, the first control circuit 115 may generate the twiddle 'Addr T' according to a particular stage of the FFT operation and may generate the stop signal when the FFT operation has been completed. The first control circuit 115 may transmit the twiddle address 'Addr T' to the twiddle factor memory 125 and transmit the stop signal to the output address counter 120.

The output address counter 120 may comprise a conventional counter circuit and may be responsive to the stop signal 'FFT DONE'. The output address counter 120 may further generate an output address signal 'Addr O' and an output signal ('OUTPUT ACTIVE') according to a particular count number. The output address counter 120 may transmit the output address signal 'Addr O' and the output signal ('OUTPUT ACTIVE') to the second control circuit 110.

The output address counter 120 may further generate various control signals, such as the 'SYNC OUT' signal and the 'ENABLE OUT' signal, which may be transmitted to a companion circuit (not shown).

Figure 5:
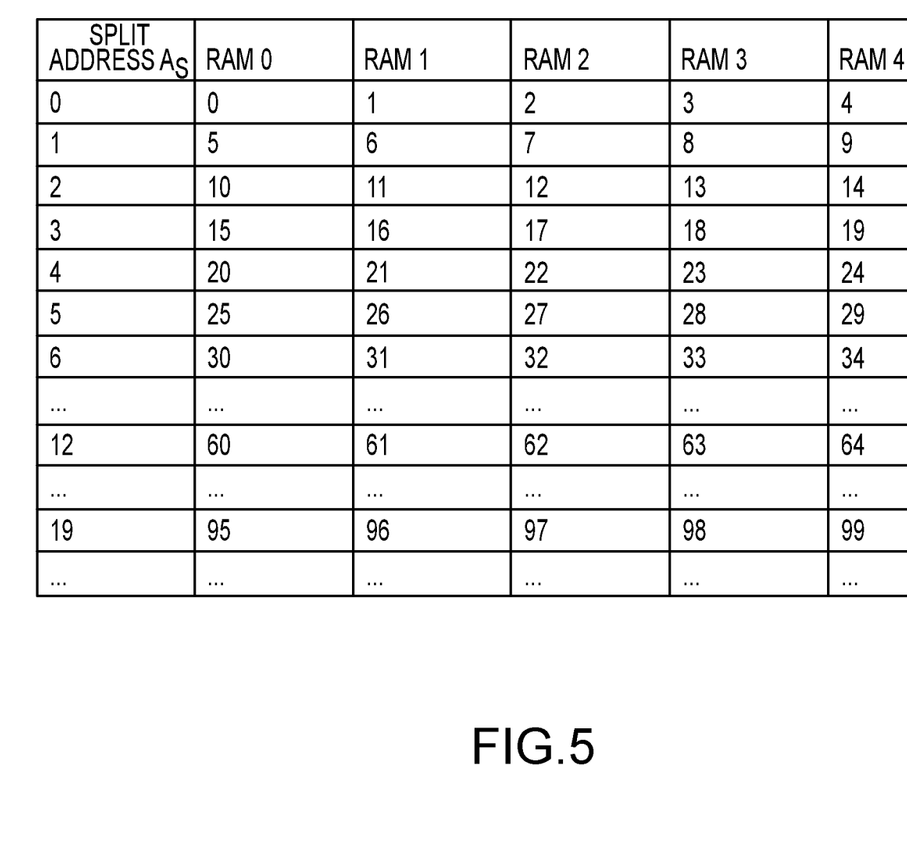
FIG. 5 representatively illustrates addressing in a storage device in accordance with an alternative embodiment of the present technology.

The main memory 160 (also referred to as RAM), may be used to store the N elements used in the FFT operation. The RAM 160 may have a single address space. According to an exemplary embodiment, the RAM 160 may be divided (i.e., partitioned) into a plurality M of sub-memory spaces 165, wherein each sub-memory space 165 is associated with a split address $A_s$ and an external address $A_e$. In particular, the external address $A_e$ maps to sub-memory space m of M and split address $A_s$ under the relation: $A_s$=floor($A_e$/M), m=$A_e$−M×$A_s$, where M is the total number of sub-memory spaces 165. For example, and referring to FIG. 5 where the RAM 160 is divided into 5 sub-memory spaces (e.g., "RAM 0," "RAM 1," "RAM 2," "RAM 3," "RAM 4" are each a sub-memory space 165 and M=5), external address 0 maps to RAM 0, split address 0 (i.e., $A_e$=0, m=0, $A_s$=0); external address 1 maps to RAM 1, split address 0 (i.e., $A_e$=1, m=1, $A_s$=0); external address 4 maps to RAM 4, split address 0 (i.e., $A_e$=4, m=4, $A_s$=0); external address 5 maps to RAM 0, split address 1 (i.e., $A_e$=5, m=0, $A_s$=1), etc.

It should be noted that the addressing method described above may be modified to accommodate a main memory (RAM) with any number sub-memory spaces. For example, the RAM 160 may have 3 sub-memory spaces, 5 sub-memory spaces, 7 sub-memory spaces, etc., and the number M of sub-memory spaces may be based on the length of the FFT and/or the particular configuration of the butterfly processor 130 (e.g., single radix base, mixed radix, or split-radix).

According to an exemplary embodiment, the total number M of sub-memory spaces is coprime with the length N of the FFT. For example, for a 32-point FFT (where N=32) and using a radix-2 FFT algorithm, the RAM 160 may be divided into 5 sub-memory spaces (i.e., M=5) since 5 is coprime with 32. For a 243-point FFT (where N=243) and using a radix-3 FFT algorithm, the RAM 160 may be divided into a number greater than 6, such as 7 or 8 sub-memory spaces, since both 7 and 8 are coprime with 243.

In a case where the length N of the FFT is a power of 2, and therefore the radix base R is also a power of 2, the RAM 160 is divided into an odd number of sub-memory spaces that is greater than twice the radix base R (or twice the maximum radix base R for a mixed radix FFT).

The RAM 160 may be connected to the second control circuit 110 and configured to receive the external address $A_e$ (e.g., A0, A1, A2, A3, A4), and a write enable signal 'WE' from the second control circuit 110. The RAM 160 may also be configured to receive data inputs, such as data inputs 'D0', 'D1', 'D2', 'D3' and 'D4'. For example, the RAM 160 may be connected to the plurality of writing multiplexers 135, wherein each writing multiplexer 135 transmits a single data input. In response to the external address $A_e$ and the write enable signal 'WE', the RAM 160 may transmit data outputs, such as data outputs 'Q0', 'Q1', 'Q2', 'Q3', and 'Q', to the plurality of reading multiplexers 190.

The butterfly processor 130 may be configured to perform an FFT algorithm, such as a Cooley-Tukey algorithm, comprising one or more butterfly operations, on N elements (i.e., N-point FFT). In general, for a radix-R implementation of length N=$R^P$, an N-point FFT requires P passes of $R^{P-1}$ butterfly operations, (which may alternatively be expressed as P passes of N/R butterfly operations). Thus, for example, an 8-point radix-2 FFT is 3 passes of 4 butterfly operations, and a 16-point radix-2 is 4 passes of 8 butterfly operations. A total number of butterfly operations H required to complete the FFT is described as: H=(N/R)$\log_{(R)}$ N.

Figure 2:
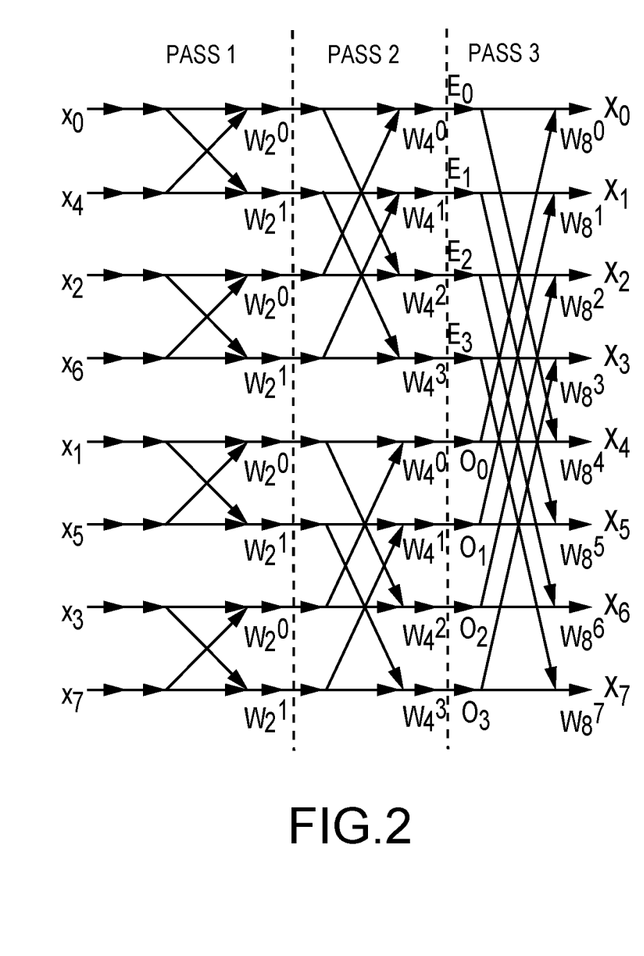
FIG. 2 representatively illustrates the order of butterfly operations and the data input and output locations using a bit-reversed input in accordance with an exemplary embodiment of the present technology.
Figure 3:
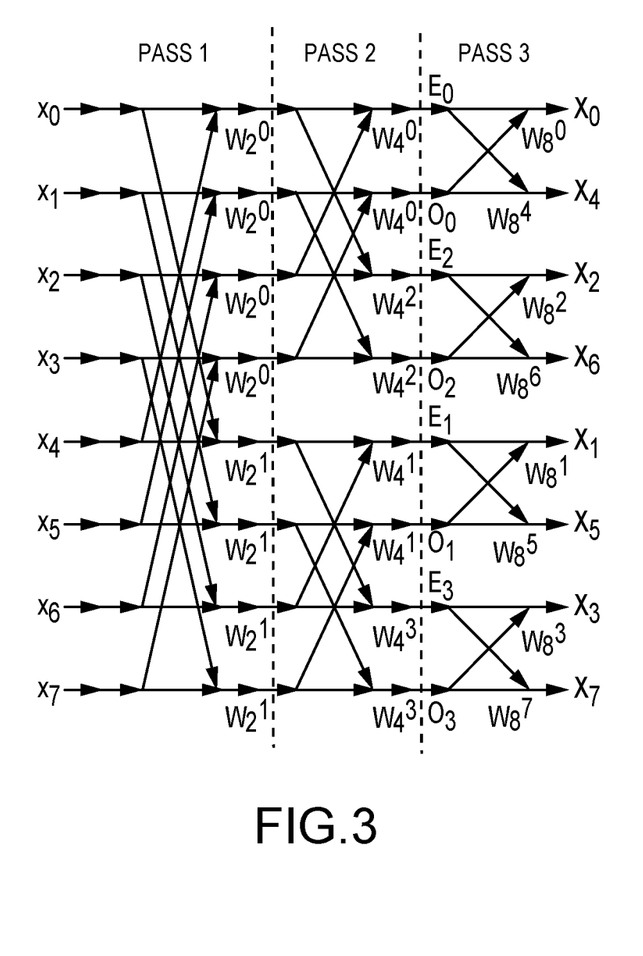
FIG. 3 representatively illustrates the order of butterfly operations and the data input and output locations using a non-reversed bit input in accordance with an exemplary embodiment of the present technology.

For example, FIGS. 2 and 3 illustrate an 8-point FFT using a radix-2, each with 3 passes (e.g., pass 1, pass 2, pass 3). Each pass comprises 4 butterfly operations such that during each pass, every element of data is read, processed, and written over by its own processing result. The butterfly processor 130 may be configured to perform the butterfly operation on a bit-reversed input (FIG. 2) or a non-reversed bit input (FIG. 3).

In a conventional system, each butterfly operation illustrated in FIGS. 2 and 3 would take at least two clock cycles in order to read the data necessary for it to operate. According to embodiments of the present technology, each butterfly operation illustrated in FIGS. 2 and 3 would take only 1 clock cycle to obtain the data before they can operate, thus the butterfly processor 130 may commence a butterfly operation on new data on each and every clock cycle. In an exemplary embodiment, the butterfly processor 130 may be pipelined internally so that it takes multiple clock cycles before a first result is produced, but a new valid result is produced on every clock cycle.

The system 100 may be configured to provide a delay such that the output data (e.g., 'DA' and 'DB') is written back to sub-memories 165 which are not being read in the same clock cycle. Alternatively, each sub-memory space 165 may comprise one or more "first-in, first-out" (FIFO) data buffers to ensure that the data being written back waits until the sub-memory space 165 is not being read. The division of the main memory 160 into the sub-memory spaces 165 as described above ensures that the data is read and written in a repeating pattern. With the exemplary embodiment of FIG. 1, on any 5 sequential clock cycles, each sub-memory space 165 may be read from on two consecutive clock cycles, which leaves three subsequent, consecutive clock cycles available for writing back the in-place data to the same sub-memory space 165 from which the data was read. This may result in a spare clock cycle from every group of five which can be used for data import or export.

The butterfly processor 130 may be configured to process any N-point FFT and may be formed using any number of FFT algorithms and with any radix base number R (i.e., radix-R). For example, the butterfly processor 130 may be implemented using a split-radix FFT, a mixed radix FFT, or a single radix algorithm. For instance, a 512-point FFT may be performed using 9 radix-2 passes of 256 butterfly operations, or a combination of 4 radix-4 passes of 128 butterfly operations and 1 radix-2 pass of 256 butterfly operations. Since a radix-4 pass requires 4 inputs, it may be convenient to allow the butterfly processor 130 to operate as 2 radix-2 butterflies in parallel. In the case of a mixed-radix FFT, a 24-point FFT may be performed using 3 radix-2 passes of 12 butterfly operations and 1 radix-3 pass of 8 butterfly operations.

According to various embodiments, the butterfly processor 130 receives input data, such as a first element $X_k$ and a second element $X_{k+(2^p)}$, where p is part of the set $\{0, 1, 2, \ldots, P-1\}$, k and $k+2^P$ each denote the external address $A_e$, and P is the total number of passes required to complete the FFT operation. According to an exemplary embodiment, the butterfly processor 130 receives the first and second elements $X_k$, $X_{k+(2^p)}$ simultaneously. The butterfly processor 130 processes each element of the N-point FFT exactly once per pass.

According to various embodiments, the butterfly processor 130 generates outputs, such as data outputs 'DA' and 'DB', as a result of the butterfly operations and transmits the outputs 'DA', 'DB' to each writing multiplexer 135 from the plurality of writing multiplexers 135.

The twiddle factor memory 125 may be configured to store a plurality of twiddle factors. Each twiddle factor T is a constant coefficient that is used in the butterfly operation. The twiddle factor memory 125 may be connected to the butterfly processor 130 and configured to transmit the twiddle factor T to the butterfly processor 130. The value of each twiddle factor T may be based on the particular FFT architecture (e.g., split-radix FFT, mixed-radix FFT, a single radix FFT), and the particular twiddle factor T transmitted to the butterfly processor 130 at any particular time may be based on a particular pass and butterfly count within the pass of the FFT algorithm.

The second control circuit 110 may be responsive to various signals from the first control circuit 115 and the input address counter 105. The second control circuit 110 may be configured to perform various control functions, such as address translation and generating various control signals, such as enable control signals and multiplexer control signals. For example, the second control circuit 110 may receive the input address 'Addr I', the 'INPUT ACTIVE' signal, and the first and second addresses 'Addr A', 'Addr B'. In response to various input signals, the second control circuit 110 may generate and transmit various select signals, address signals, and write enable signals.

The second control circuit 110 may comprise a division circuit (not shown) configured to perform a division operation by a constant C in order to convert the external address $A_e$ to a particular sub-memory space 165 and the split address $A_s$ associated with that particular sub-memory space 165. According to various embodiments, the constant C used in the division circuit may be the same as the total number M of sub-memory spaces 165. For example, in the present embodiment, the RAM 160 comprises five (5) sub-memory spaces 165, therefore the division circuit will be configured to divide by 5. Accordingly, the constant C may vary depending on the number M of sub-memory spaces 165.

Figure 4:
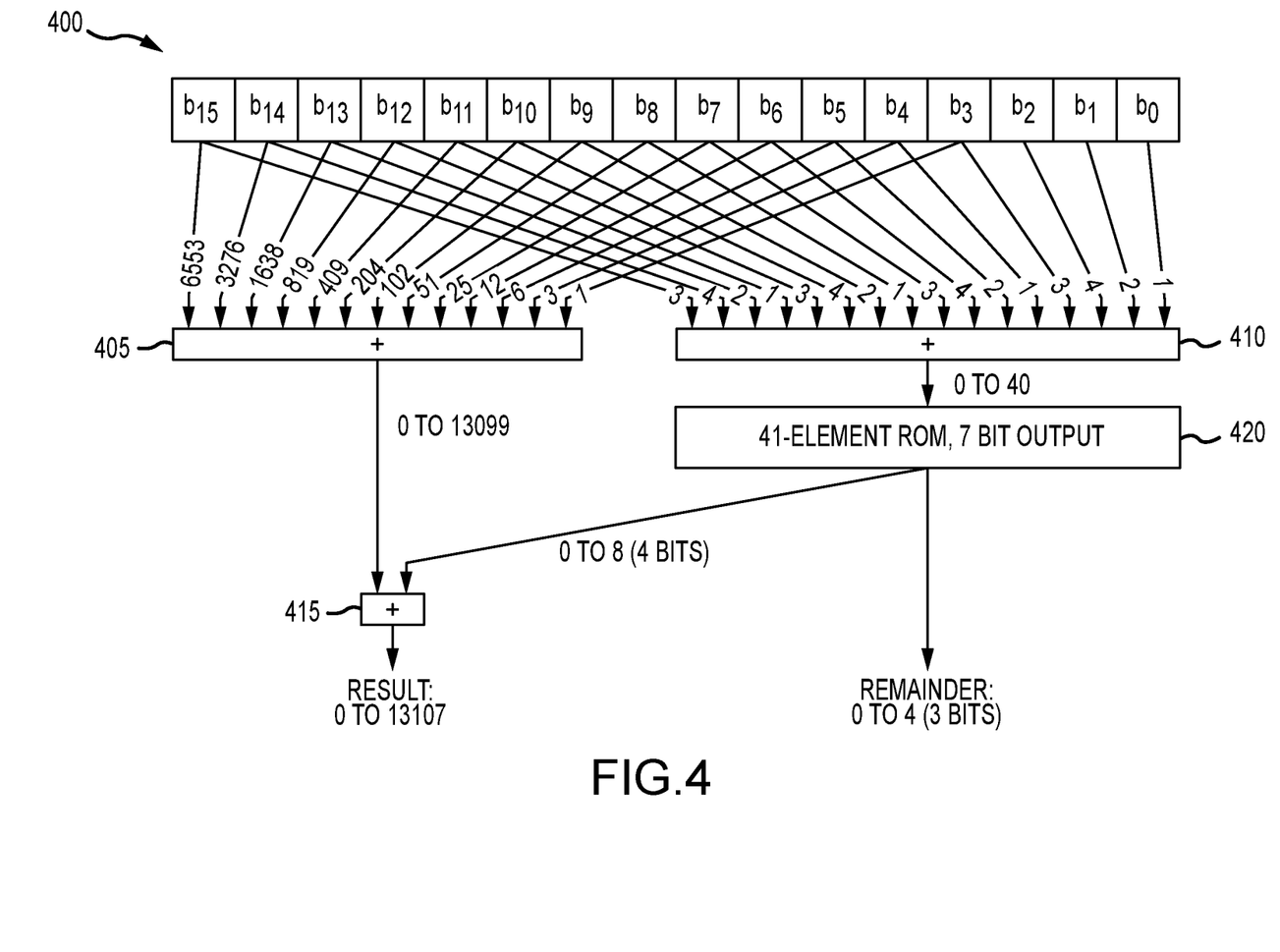
FIG. 4 representatively illustrates a division operation in accordance with an exemplary embodiment of the present technology.

In one embodiment and referring to FIG. 4, the second control circuit 110 and/or the division circuit may be configured to perform a bit-wise division operation 400. According to the bit-wise division operation 400, an unsigned integer of B-bits is divided by the constant C. For example, in a case of a 16-bit number, for each bit $b_{15}$ to $b_3$, a result of a division operation (i.e., a first quotient result) is transmitted to a first adder 405 and a remainder (i.e., a first remainder) is transmitted to a second adder 410. The second adder 410 may receive a plurality of first remainders to form a sum of remainders.

A circuit 420, such as a read-only memory (ROM) device or a combinational logic device, may then be utilized to generate an output, wherein a portion of the output (i.e., a second quotient result) is transmitted to a third adder 415 and the remaining output represents a final remainder. The circuit 420 may comprise a lookup table to facilitate generating the second quotient result and the final remainder. For example, assuming a division by 5 (i.e., C=5) and given an unsigned 16-bit number, if bit $b_{15}$ represents 32768, then 32768/5=6553 rem 3, and if bit $b_{14}$ represents 16384, then 16384/5=3276 rem 4, etc. Bits $b_2$ to $b_0$ have remainders but no division result (since 4/5=0 rem 4, 2/5=0 rem 2 and 1/5=0 rem 1).

If $b_{15}$ is set (1), the value 6553 is transmitted to the first adder 405 and the value 3 is transmitted to the second adder 410. If bit $b_{15}$ is clear (0), the value 0 is transmitted to the first adder 405 and the value 0 is transmitted to the second adder 410. Similarly, if bit $b_{14}$ is set (1), the value 3276 is transmitted to the first adder 405 and the value 4 is transmitted to the second adder 410, regardless of the result of the result of bit $b_{15}$. Each bit is processed in the same way. This operation produces a division result in the range 0 to 13099 and a remainder in the range 0 to 40. The ROM or the combinational logic device may then be used to divide, in this particular example, a 6-bit unsigned integer by 5 to again produce a quotient and a remainder. The third adder 415 adds the quotient (range 0 to 8), which is a 4-bit number, to the division result from the first adder 405 to produce a final result in the range 0 to 13107 (=65535/5). The remainder is a 3-bit number in the range 0 to 4.

Figure 6:
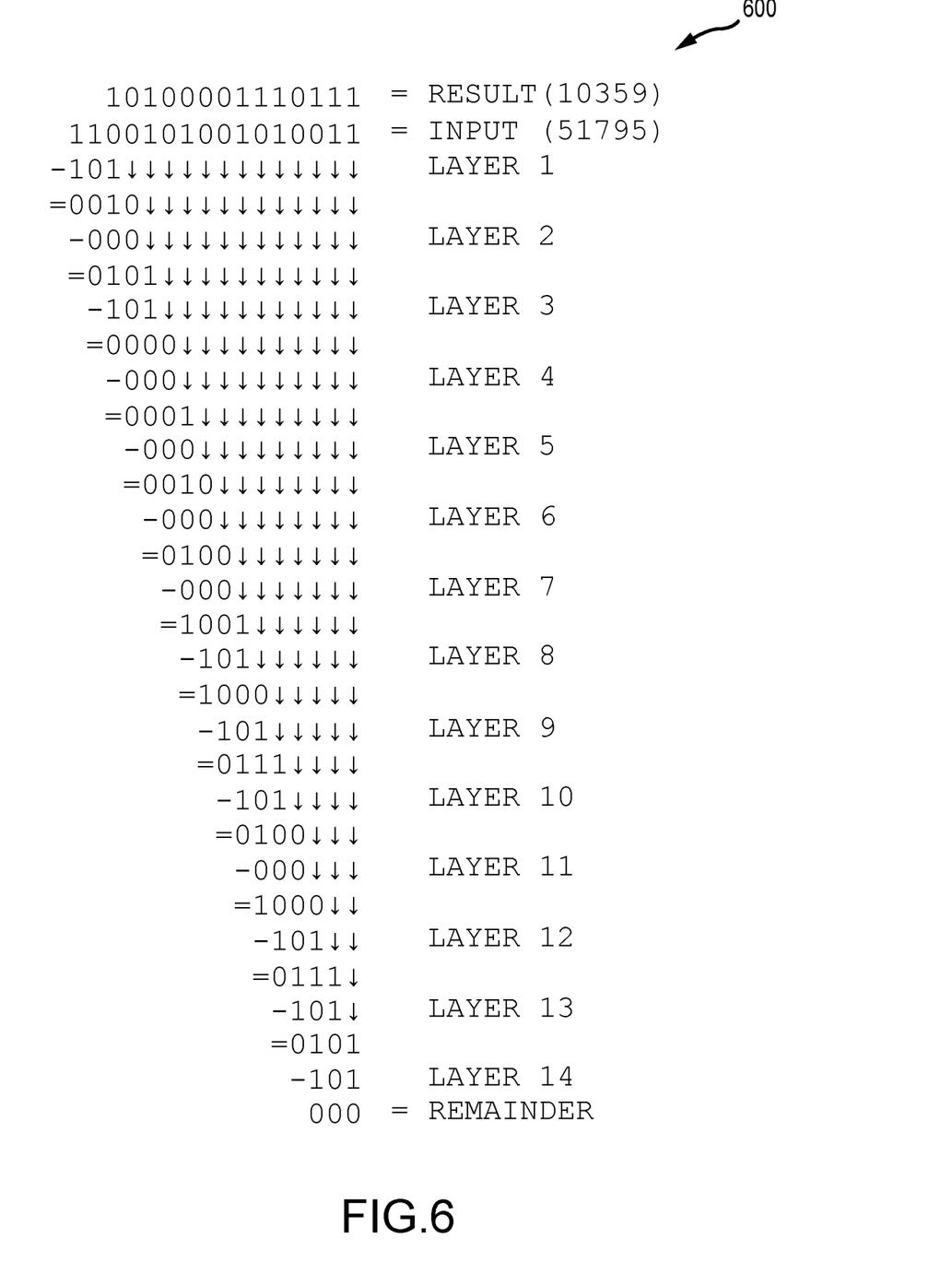
FIG. 6 representatively illustrates a division operation in accordance with an alternative embodiment of the present technology.

In an alternative embodiment, and referring to FIG. 6, the division circuit may be configured to perform a long division operation 600. According to the present embodiment, the long division operation results in conditionally-dependent layers, wherein each layer depends on the result from the previous layer.

Each writing multiplexer 135 facilitates selection and transmission of the input data to the RAM 160. Each writing multiplexer 135 may be connected to the second control circuit 110 and configured to receive a select signal, such as select signals 'W0_sel', 'W1_sel', 'W2_sel', 'W3_sel', and 'W4_sel', wherein each select signal is transmitted to a different writing multiplexer 135. Each writing multiplexer 135 may be further configured to receive the input data ('DATA IN'). Each writing multiplexer 135 may be further configured to receive output data from the butterfly processor 130, such as output data 'DA', 'DB'.

According to various embodiments, each writing multiplexer 135 may comprise a conventional multiplexer circuit for selecting and transmitting one of several input signals to a single output line.

Each reading multiplexer 190 facilitates retrieval and transmission of data stored in the RAM 160. For example, each reading multiplexer 190 receives the output data, for example data 'Q0', 'Q1', 'Q2', 'Q3', 'Q4'. A first reading multiplexer 190(0) may be configured to selectively transmit the data out of the system 100 to the companion circuit (not shown). A second reading multiplexer 190(1) and a third reading multiplexer 190(2) may be configured to selectively transmit the data to the butterfly processor 130 for use in the butterfly operation.

According to various embodiments, each reading multiplexer 190 may comprise a conventional multiplexer circuit for selecting and transmitting one of several input signals to a single output line.

According to various embodiments, the system 100 may be controlled by a system clock (not shown), having a system frequency fs, that controls the rate of transfer and timing of the input data ('DATA IN'), the output data (data may be gated by the 'ENABLE IN' control signal) and the 'ENABLE OUT' control signal. The system 100 may assert the 'SYNC IN' signal at the same time as each sub-memory space 165 receives the first input and may assert the 'SYNC OUT' signal at the same time as each sub-memory space 165 outputs data.

According to various embodiments, the system 100 may further comprise a core clock having a core frequency fc. The core frequency fc is approximately 5 to 10 times higher than that of the system frequency fs.

The main memory 160, the second control circuit 110, the plurality of reading multiplexers 190, and the plurality of writing multiplexers 130 may be referred to collectively as a composite memory. Accordingly, the composite memory comprises a plurality of reading ports, for example ports for 'Addr A', 'QA', 'Addr B', 'QB', 'Addr O', and 'DATA OUT'. Similarly, the composite memory further comprises a plurality of writing ports, for example ports for 'Addr I', 'DATA IN', 'Addr AD', 'DA', 'Addr BD', and 'DB'.

In operation, and referring to FIG. 1, various embodiments of the present technology perform an in-place fast Fourier transform operation. According to various embodiments, the system 100 may simultaneously read two data elements from the main memory 160 and in a subsequent clock cycle, simultaneously write two data elements to the main memory 160.

According to an exemplary operation, the system 100 receives input data and transmits the input data to the plurality of writing multiplexers 135. The second control circuit 110 may then selectively activate one or more of the plurality of writing multiplexers 135, wherein activation of the writing multiplexer selectively outputs one of the several inputs to the main memory 160. For example, the first writing multiplexer 135(0) transmits data to the first sub-memory space 165(0), the second writing multiplexer 135(1) transmits data to the second sub-memory space 165(1), the third writing multiplexer 135(2) transmits data to the third sub-memory space 165(2), the fourth writing multiplexer 135(3) transmits data to the fourth sub-memory space 165(3), and the fifth writing multiplexer 135(4) transmits data to the fifth sub-memory space 165(4).

The system 100 may then read data elements, such the first element $X_k$ and the second element $X_{k+(2^p)}$ from the main memory 160 simultaneously, wherein each element is stored in a different sub-memory space 165. For example, the second control circuit 110 selectively operates the second and third reading multiplexers 190(1), 190(2), wherein each of the second and third reading multiplexers transmits one of several inputs to the butterfly processor 130. The butterfly processor 130 receives inputs 'QA' and 'QB', performs a butterfly operation and transmits the results (outputs 'DA' and 'DB') of the operation back to the writing multiplexers 135. The writing multiplexers are again selectively activated to simultaneously transmit the outputs 'DA' and 'DB' back to the same sub-memory component 165 where the inputs 'QA' and 'QB' were retrieved from. Accordingly, the results of the FFT operation are written back to the main memory 160 simultaneously. According to various embodiments, the data elements $X_k$, $X_{k+(2^p)}$ are retrieved from different sub-memory spaces 165 within the main memory 160.

As a result of the addressing pattern described above with respect to the main memory 160, the system 100 is able to read and write data from the same main memory 160. For example, for 32-point FFT (length of 32) and utilizing a radix-2 algorithm, the addressing pattern for each pass P is as follows:

| Pass | External address (Ae) used for reading/writing |
| --- | --- |
| 1 | Ae, Ae + 1 |
| 2 | Ae, Ae + 2 |
| 3 | Ae, Ae + 4 |
| 4 | Ae, Ae + 8 |
| 5 | Ae, Ae + 16 |

In another example, for a 243-point FFT (length of 243) and utilizing a radix-3 algorithm, the addressing pattern for each pass P is as follows:

| Pass | External address (Ae) used for reading/writing |
| --- | --- |
| 1 | Ae, Ae + 1, Ae + 2 |
| 2 | Ae, Ae + 3, Ae + 6 |
| 3 | Ae, Ae + 9, Ae + 18 |
| 4 | Ae, Ae + 27, Ae + 54 |
| 5 | Ae, Ae + 81, Ae + 162 |

This addressing pattern allows the system 100 to decrease the processing time of the FFT algorithm and further prevents the system 100 from reading/writing data to/from the same sub-memory space 165. Accordingly, the 5 sub-memory spaces 165(0):165(4) can operate with a bandwidth that is five times the core frequency fc of the core clock, which allows the system 100 to read two data elements per core clock cycle and write two data elements per core clock cycle. As a result, a spare clock cycle occurs after every 5 clock cycles of the core clock, which allows input and output of future/previous data in/out of the system 100.

Figure 7:
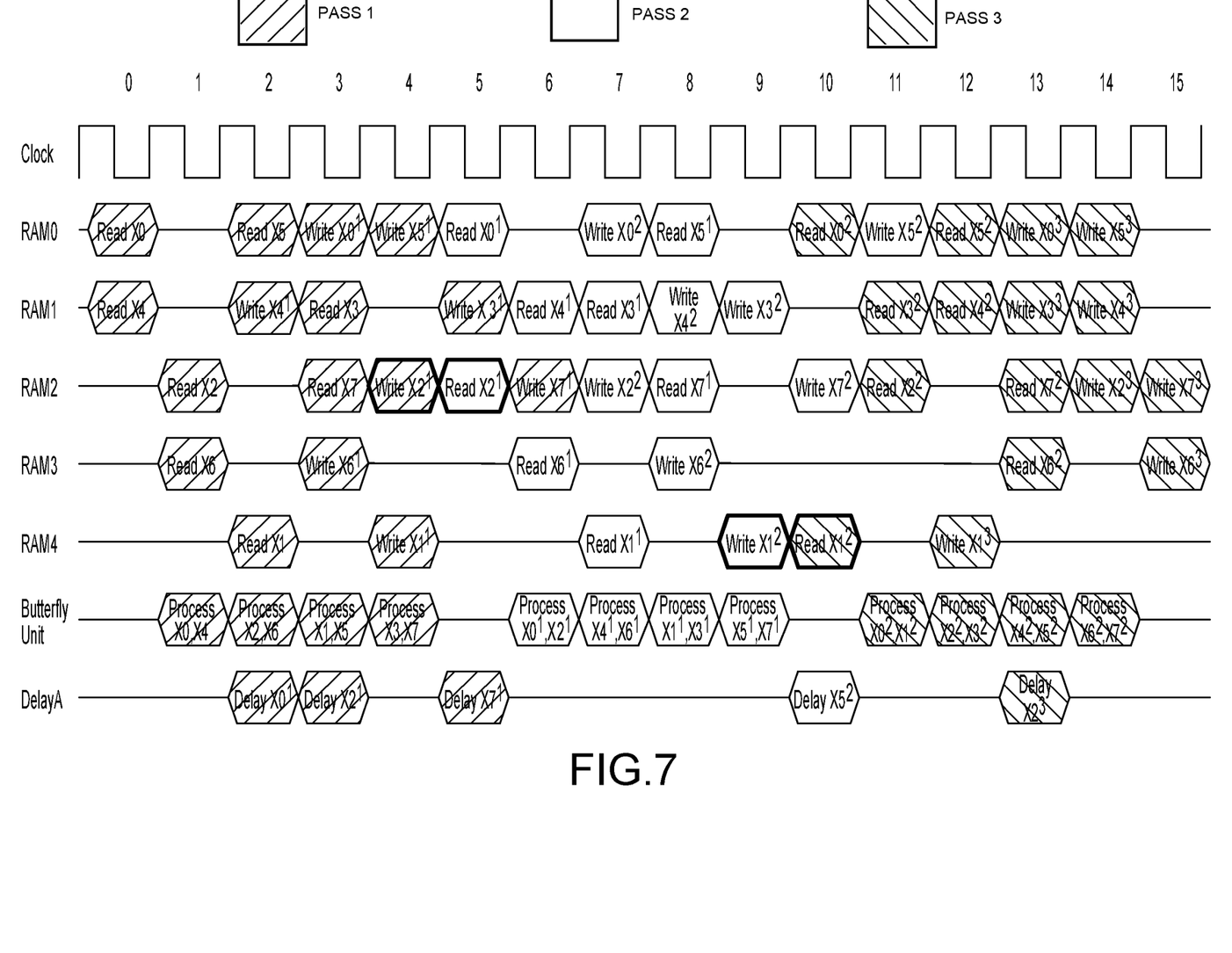
FIG. 7 is a timing diagram for performing an 8-point, radix-2 FFT.

Referring to FIG. 7, in an exemplary operation, the system 100 may perform an 8-point radix-2 FFT. In the present case, the data is stored with its 3-bit address reversed. Thereafter, each data element is divided by 5 so data elements X0 and X5 are in RAM0, data elements X4 and X3 are in RAM1, data elements X2 and X7 are in RAM2, data element X6 is in RAM3, and data element X1 is in RAM4.

On clock cycle 0, X0 is read from RAM0 and X4 is read from RAM1.

On clock cycle 1, X2 is read from RAM2 and X6 is read from RAM3, X0 and X4 are processed in the butterfly processor 130 to produce $X0^1$ and $X4^1$.

On clock cycle 2, X1 is read from RAM4 and X5 is read from RAM0, X2 and X6 are processed in the butterfly processor 130 to produce $X2^1$ and $X6^1$, $X4^1$ is written to RAM1 and $X0^1$ is delayed because RAM0 is busy.

On clock cycle 3, X3 is read from RAM1 and X7 is read from RAM2, X1 and X5 are processed in the butterfly processor 130 to produce $X1^1$ and $X5^1$, $X0^1$ is written to RAM0 and $X6^1$ is written to RAM3, $X2^1$ is delayed because RAM 2 is busy.

On clock cycle 4, no data is read, X3 and X7 are processed in the butterfly processor 130 to produce $X3^1$ and $X7^1$, $X1^1$ is written to RAM4, X2' is written to RAM2 and $X5^1$ is written to RAM3.

In the present implementation, each pass of the FFT takes only 4 clock cycles and the pipelined delay from reading to writing back is 3 clock cycles. This condition may cause the butterfly processor 130 to stall. For example, to start pass 2, it is desired to read $X2^1$ on clock cycle 4, but $X2^1$ is not yet in the main memory 160. Accordingly, the butterfly processor 130 must wait until clock cycle 5 before reading $X2^1$ and this causes the butterfly processor 130 to stall, so that there is no processing operation in cycle 5. In an exemplary embodiment, reading from a sub-memory space 165 may take priority over writing to that same sub-memory space 165.

In the present case, the system 100 comprises a delay (e.g., 'DelayA') to delay writing the results from the butterfly processor 130 back to one of the sub-memory spaces 165. The delay may be needed when the butterfly processor 130 is reading a data element from the same sub-memory space that is also being written to. For example, in clock cycle 2, the butterfly processor 130 is reading X5, so writing $X0^1$ to RAM0 is delayed by one clock cycle.

Figure 8A:
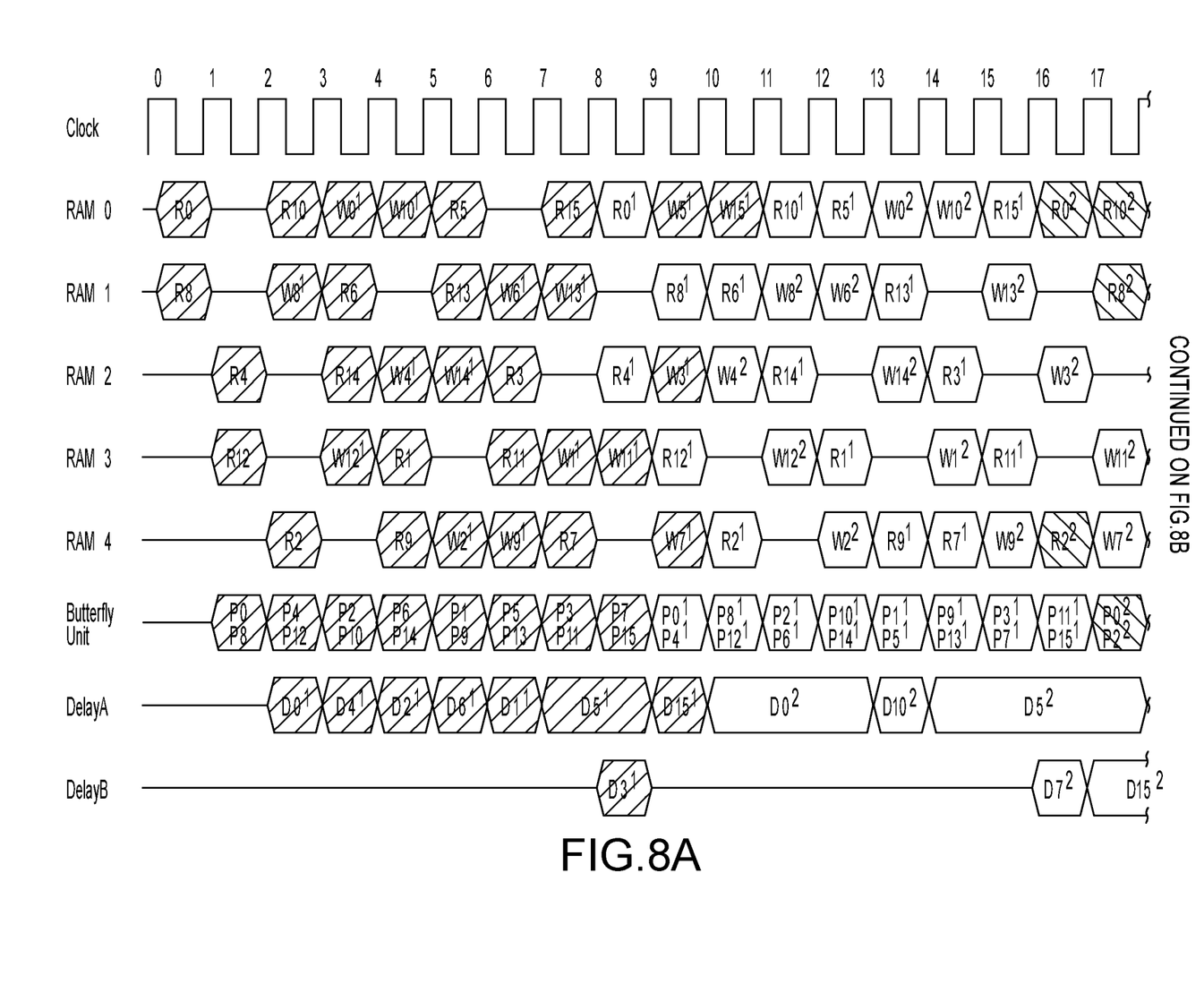
FIGS. 8A-8B are a timing diagram for performing a 16-point, radix-2 FFT.
Figure 8B:
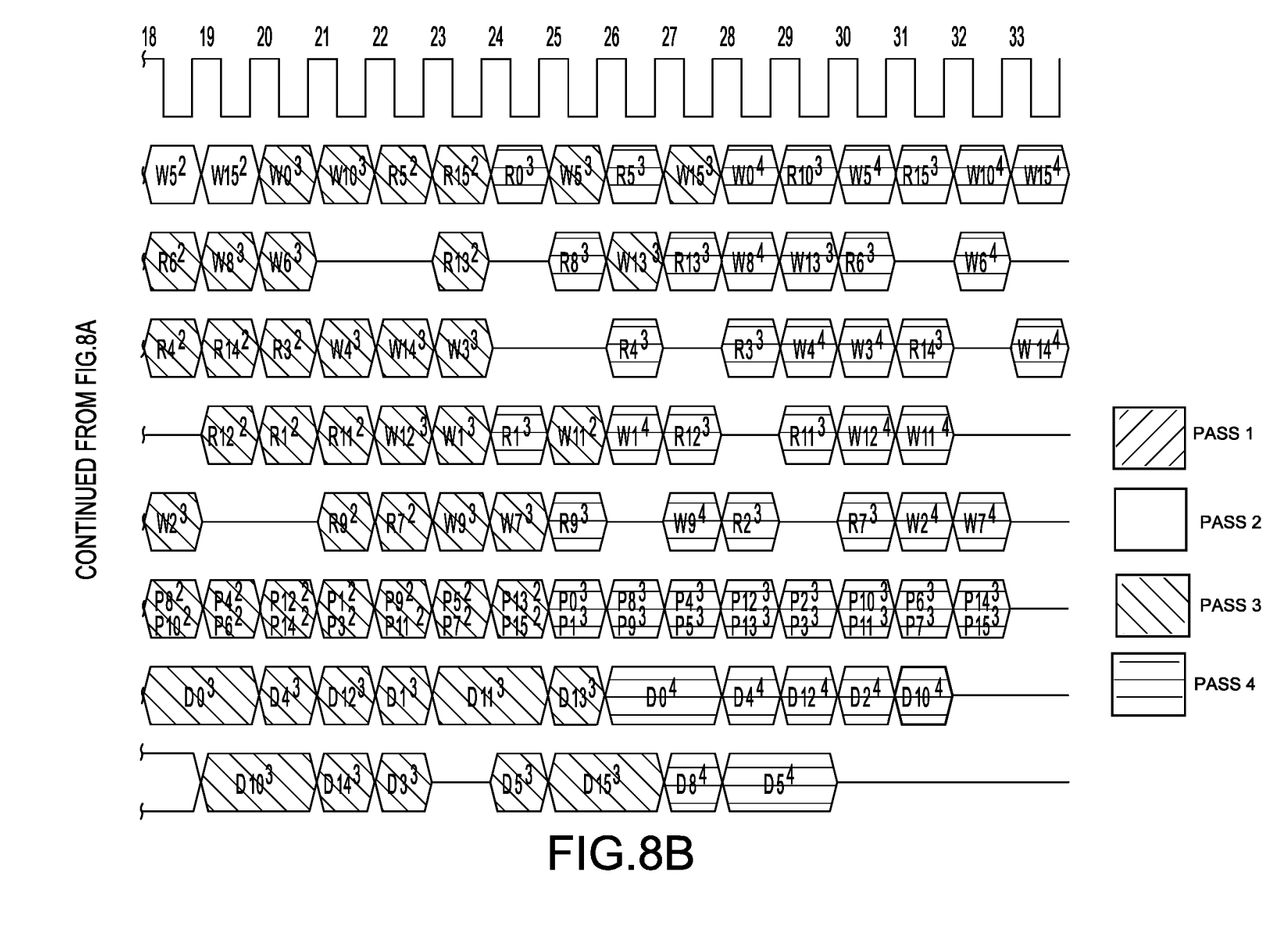

In an alternative operation with a longer FFT, and referring to FIGS. 8A-8B, the butterfly processor 130 is able to process the data elements and generate processed data sequentially for the duration of the FFT operation. For example, with a length 16, radix-2 FFT, each pass takes 8 clock cycles and there is plenty of time for the data that is operated on first to be written back to the RAM 160 before it is needed at the start of the next pass without pausing the operation of the butterfly processor 130.

In the present case, data elements X0, X5, X10, and X15 are stored in RAM0; data elements X8, X13, and X6 are stored in RAM1; data elements X4, X14, and X3 are stored in RAM2; data elements X12, X1, and X11 are stored in RAM3; and X2, X9, and X7 are stored in RAM4. Reading from the main memory 160 is denoted as 'R', writing to the main memory 160 is denoted as 'W', processing with the butterfly processor 130 is denoted as 'P', and delaying is denoted as 'D'. For example, 'R0' denotes reading X0, 'W0' denotes writing X0, '$D0^1$' denotes delaying $X0^1$, etc. The results of the butterfly processor 130 are denoted with superscripts 1, 2, 3, and 4, where superscript 1 denotes the result of the processing on the first pass, superscript 2 denotes the results of processing on the second pass, superscript 3 denotes the results of processing on the third pass, and superscript 4 denotes the results of processing on the fourth pass.

In the present case, the system 100 comprises a first delay (e.g., 'DelayA') and a second delay (e.g., 'DelayB'). The first and second delays are used in a similar manner as described above.

According to various embodiments, the butterfly processor 130 performs a total number of H sequential butterfly processing operations to complete the in-place FFT. For example, in the present case where the FFT is length 16, the butterfly processor 130 performs 32 sequential butterfly processing operations (H=32). Additionally, each butterfly processing operation is performed within a single cycle of the core clock, and the total number of H butterfly processing operations (in this case 32) is completed within the same number of core clock cycles (i.e., 32 core clock cycles). Accordingly, the number of core clock cycles required to complete the FFT depends on the length of the FFT, the radix number, the number of passes, and the number of butterfly operations per pass.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. A signal processor configured to perform an in-place fast Fourier transform (FFT), comprising:
a random access memory (RAM) having a single address space, wherein the RAM is divided into a fixed number of sub-memory spaces comprising a first sub-memory space, a second sub-memory space, a third sub-memory space, and a fourth sub-memory space; and wherein the fixed number is coprime with a length of the FFT; and
a butterfly processor connected to the RAM and configured to:
simultaneously read:
a first data element from the first sub-memory space; and
a second data element from the second sub-memory space; and
simultaneously write:
a third data element to the third sub-memory space; and
a fourth data element to the fourth sub-memory space.

2. The signal processor of claim 1, further comprising:
a plurality of reading multiplexers connected between the butterfly processor and the RAM and configured to selectively transmit the first and second data elements from the RAM to the butterfly processor; and
a plurality of writing multiplexers connected between the butterfly processor and the RAM and configured to selectively transmit the third and fourth data elements from the butterfly processor to the RAM.

3. The signal processor of claim 1, further comprising a division circuit configured to divide a binary number, comprising a plurality of bits, by the fixed number;
wherein:
each bit from the plurality of bits is represented by a power of 2; and
the division circuit is further configured to divide each bit of the binary number by the fixed number to obtain a plurality of division results and a plurality of remainders.

4. The signal processor of claim 1, wherein each sub-memory space is related to a sub-memory number, a split address and an external address according to the expressions: $A_s=\text{floor}(A_e/M)$, and $m=A_e-M\times A_s$, where M is the fixed number of sub-memory spaces, m is the sub-memory number, $A_s$ is the split address, and $A_e$ is the external address.

5. The signal processor of claim 1, wherein the number of sub-memory spaces is an odd number and the length of the FFT is a power of 2.

6. The signal processor of claim 1, wherein each sub-memory space comprises a data buffer configured to delay writing a fifth data element to one of the first and second sub-memory spaces.

7. The signal processor of claim 1, further comprising a data buffer, having a variable delay, positioned between an output of the butterfly processor and the input of the RAM.

8. The signal processor of claim 1, wherein:
the butterfly processor performs a total number of H butterfly processing operations to complete the in-place FFT;
each butterfly processing operation from the total number H is performed within a single cycle of a core clock; and
the total number of H butterfly processing operations is completed within a number of K core clock cycles, where K is equal to H.

9. A method for performing an in-place fast Fourier transform (FFT), comprising:
providing a main storage having a single address space, wherein the main storage is divided by a fixed number to form a plurality of sub-memory spaces comprising a first sub-memory space and a second sub-memory space; wherein the fixed number of sub-memory spaces is coprime with a length of the FFT;
performing, with a butterfly processor, a first butterfly operation comprising:
simultaneously reading:
a first data element from the first sub-memory space; and
a second data element from the second sub-memory space;
processing the first and second data elements; and
writing:
the processed first data element to the first sub-memory space; and
the processed second data element to the second sub-memory space;
performing, with the butterfly processor, a second butterfly operation comprising:
reading a third data element from the first sub-memory space; and
delaying writing one of the first and second processed data elements to prevent simultaneously writing one of the first and second data elements to the first sub-memory space and reading the third data element from the first memory space.

10. The method of claim 9, wherein each sub-memory space from the plurality of sub-memory spaces is related to a sub-memory number, a split address and an external address according to the expressions: $A_s=\text{floor}(A_e/M)$, and $m=A_e-M\times A_s$, where M is the fixed number of sub-memory spaces, m is the sub-memory number, $A_s$ is the split address and $A_e$ is the external address.

11. The method of claim 9, wherein:
the butterfly processor performs a total number of H butterfly operations to complete the in-place FFT;
each butterfly operation from the total number H is performed within a single cycle of a core clock; and
the total number of H butterfly operations is completed within a number of K core clock cycles, where K is equal to H.

12. A system configured to perform an in-place fast Fourier transform (FFT), comprising:
a random access memory (RAM) having a single address space, wherein the RAM is divided into a fixed number of sub-memory spaces, and wherein the number of sub-memory spaces is coprime with a length of the FFT; and a butterfly processor connected to the RAM and configured to perform a plurality of butterfly operations, wherein each butterfly operation from the plurality of butterfly operations commences on consecutive cycles of a core clock;

wherein the system prevents simultaneous reading data from and writing data to a same sub-memory space, which is one from the fixed number of sub-memory spaces.

13. The system of claim 12, further comprising a division circuit, wherein the division circuit is configured to divide each bit of the binary number by the fixed number to obtain a plurality of division results and a plurality of remainders.

14. The system of claim 12, wherein:
the butterfly processor performs a total number of H butterfly operations to complete the in-place FFT; and
the total number of H butterfly operations is completed within a number of K core clock cycles, where K is equal to H.

15. The system of claim 12, wherein, in one clock cycle, the butterfly processor:
simultaneously receives:
a first data element from a first sub-memory space; and
a second data element from a second sub-memory space;
processes the first and second data elements; and
simultaneously transmits:
the processed first data element to the first sub-memory space; and
the processed second data element to the second sub-memory space.

16. The system of claim 12, wherein the number of sub-memory spaces is an odd number and the butterfly processor is configured to perform a radix-2 FFT algorithm.

17. The system of claim 12, wherein:
the system operates according to a system clock having a system frequency and the butterfly processor operates according to the core clock having a core frequency;
the core frequency is higher than that of the system frequency; and
the system clock controls a rate of transfer of input data into the system and output data out of the system.

18. The system of claim 12, wherein each sub-memory space is related to a sub-memory number, a split address and an external address according to the expressions: $A_s$=floor $(A_e/M)$, and $m=A_e-M \times A_s$, where M is the fixed number of sub-memory spaces, m is the sub-memory number, $A_s$ is the split address and $A_e$ is the external address.

19. The system of claim 12, wherein each sub-memory space comprises a data buffer configured to provide a delay between writing data and reading data.

20. The system of claim 12, further comprising a data buffer with a variable delay positioned between an output of the butterfly processor and the input of the RAM.

* * * * *